(12) United States Patent
Nakazawa et al.

(10) Patent No.: US 12,400,893 B2
(45) Date of Patent: Aug. 26, 2025

(54) SUBSTRATE DETACHING APPARATUS

(71) Applicant: SHINKO ELECTRIC INDUSTRIES CO., LTD., Nagano (JP)

(72) Inventors: Shinji Nakazawa, Nagano (JP); Michio Horiuchi, Nagano (JP)

(73) Assignee: SHINKO ELECTRIC INDUSTRIES CO., LTD., Nagano (JP)

(*) Notice: Subject to any disclaimer, the term of this patent is extended or adjusted under 35 U.S.C. 154(b) by 521 days.

(21) Appl. No.: 17/658,472

(22) Filed: Apr. 8, 2022

(65) Prior Publication Data

US 2022/0336195 A1 Oct. 20, 2022

(30) Foreign Application Priority Data

Apr. 15, 2021 (JP) ................................ 2021-069297

(51) Int. Cl.
*H01L 21/677* (2006.01)
*H01J 37/32* (2006.01)
*H01L 21/687* (2006.01)
*H01L 23/467* (2006.01)

(52) U.S. Cl.
CPC .. *H01L 21/67748* (2013.01); *H01J 37/32715* (2013.01); *H01L 21/68742* (2013.01); *H01L 23/467* (2013.01)

(58) Field of Classification Search
CPC ......... H01L 21/67748; H01L 21/68742; H01L 23/467; H01J 37/32715
See application file for complete search history.

(56) References Cited

U.S. PATENT DOCUMENTS

| | | | | |
|---|---|---|---|---|
| 5,240,546 | A * | 8/1993 | Shiga | H01L 21/67132 73/768 |
| 6,612,590 | B2 * | 9/2003 | Coomer | H01L 21/6838 279/158 |
| 11,600,472 | B2 * | 3/2023 | Isomura | H01L 21/67184 |
| 2009/0056112 | A1 * | 3/2009 | Kobayashi | H02N 13/00 29/729 |
| 2010/0248490 | A1 | 9/2010 | Mcmillin et al. | |
| 2013/0048222 | A1 * | 2/2013 | Tanaka | H01L 21/68742 156/707 |

FOREIGN PATENT DOCUMENTS

JP 2015-216391 12/2015

* cited by examiner

*Primary Examiner* — Eric A. Gates
(74) *Attorney, Agent, or Firm* — IPUSA, PLLC (57) ABSTRACT

A substrate detaching apparatus for detaching a substrate attracted to and held onto an attraction surface of an electrostatic chuck includes a moving unit configured to push and move the substrate in a direction parallel to the attraction surface.

10 Claims, 10 Drawing Sheets

SUBSTRATE DETACHING APPARATUS

CROSS-REFERENCE TO RELATED APPLICATIONS

The present application is based upon and claims priority to Japanese Patent Application No. 2021-069297 filed on Apr. 15, 2021, with the Japanese Patent Office, the entire contents of which are incorporated herein by reference.

FIELD

The disclosures herein relate to substrate detaching apparatuses.

BACKGROUND

A film deposition apparatus (e.g., a chemical vapor deposition apparatus, a physical vapor deposition apparatus, or the like) and a plasma etching apparatus are used in the process of manufacturing a semiconductor device such as an IC (integrated circuit) or an LSI (large scale integration). These apparatuses have a stage for holding a substrate in place with high accuracy in a vacuum processing chamber.

An example of such a stage is a substrate holding apparatus that attracts and holds a substrate, i.e., an object to be attracted, with an electrostatic chuck mounted on a baseplate. After the completion of processing of the substrate, lift pins that are movable perpendicularly to the attraction surface are used to vertically lift up and detach the substrate from the electrostatic chuck.

The speed and accuracy of a substrate detaching action vary due to the effect of a residual attraction force of the electrostatic chuck, which gives rise to a problem of a delay in the transfer of a substrate and misalignment upon detachment. Various studies have been conducted to reduce the effect of a residual attraction force of an electrostatic chuck, but a further reduction of the effect of a residual attraction force is required.

In consideration of the above, it may be desired to provide a substrate detaching apparatus that is capable of reducing the effect of a residual attraction force of an electrostatic chuck.

RELATED-ART DOCUMENTS

Patent Document

[Patent Document 1] Japanese Laid-open Patent Publication No. 2015-216391

SUMMARY

According to an aspect of the embodiment, a substrate detaching apparatus for detaching a substrate attracted to and held onto an attraction surface of an electrostatic chuck includes a moving unit configured to push and move the substrate in a direction parallel to the attraction surface.

The object and advantages of the embodiment will be realized and attained by means of the elements and combinations particularly pointed out in the claims. It is to be understood that both the foregoing general description and the following detailed description are exemplary and explanatory and are not restrictive of the invention, as claimed.

DESCRIPTION OF EMBODIMENTS

In the following, embodiments will be described by referring to the accompanying drawings. In these drawings, the same elements are referred to by the same references, and a duplicate description thereof may be omitted.

First Embodiment

The first embodiment is directed to a substrate detaching apparatus that is used together with a substrate holding apparatus having an electrostatic chuck and that detaches a substrate attracted to and held onto the surface of the electrostatic chuck. The general configuration of the substrate holding apparatus to which the substrate detaching apparatus is applied will be described first, and, then, the substrate detaching apparatus will be described.

[General Configuration of Substrate Holding Apparatus]

Figure 1A:
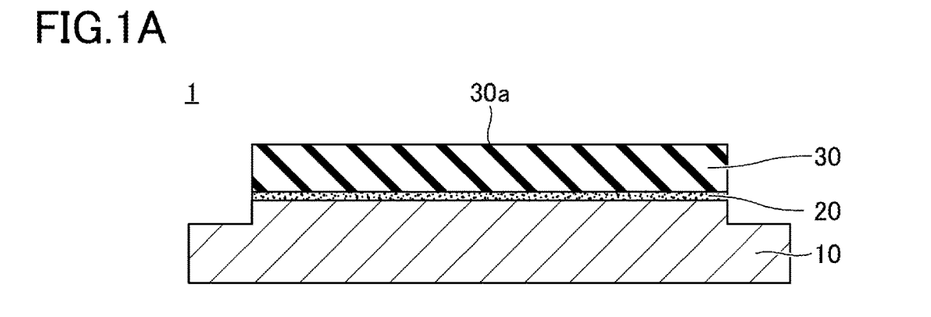
FIGS. 1A through 1C are drawings providing schematic illustrations of a substrate holding apparatus.
Figure 1B:
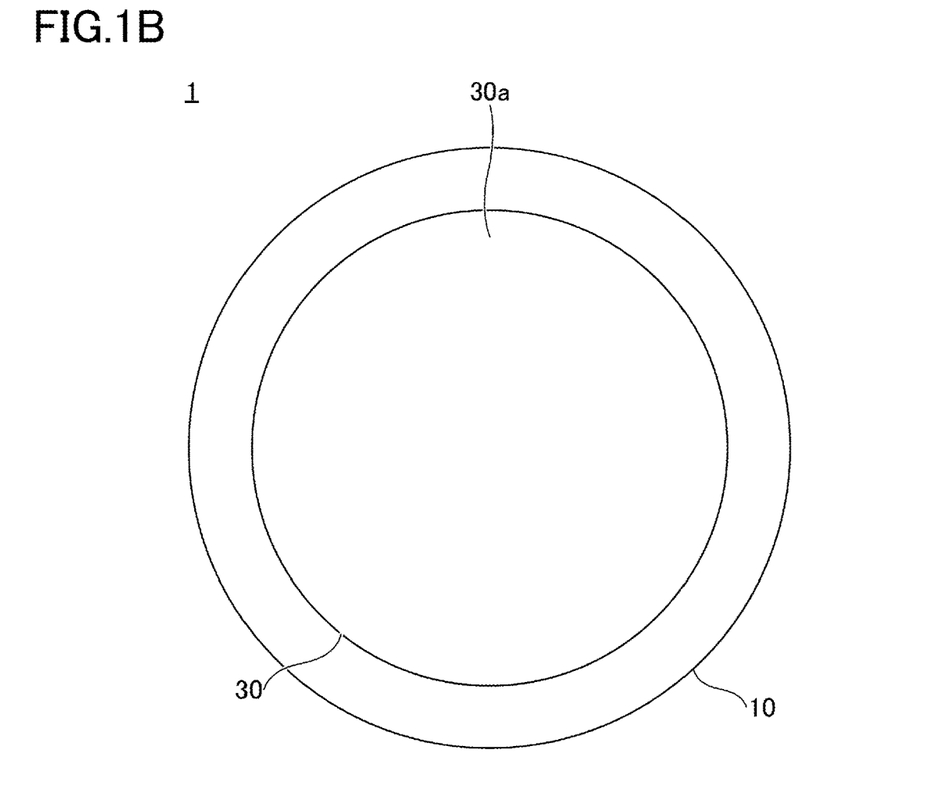
Figure 1C:
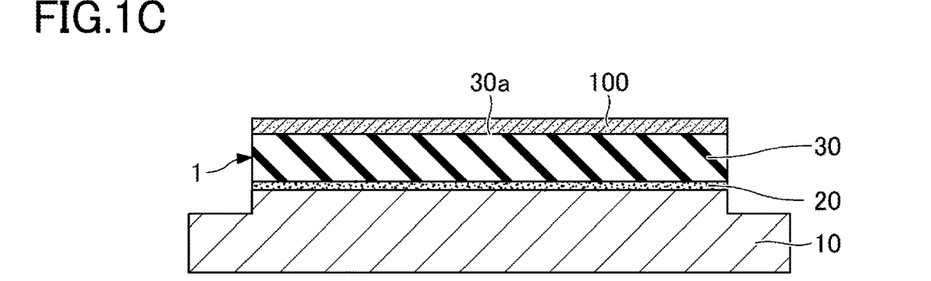

FIGS. 1A through 1C are drawings providing schematic illustrations of the substrate holding apparatus. FIG. 1A and FIG. 1C are cross-sectional views, and FIG. 1B is a plan view. As illustrated in FIG. 1A and FIG. 1B, a substrate holding apparatus 1 includes a baseplate 10, an adhesive layer 20, and an electrostatic chuck 30 as main components.

The electrostatic chuck 30 is fixedly attached to one surface of the baseplate 10 through the adhesive layer 20. A surface 30a is an attraction surface onto which an object is attracted and held. As illustrated in FIG. 1C, the substrate holding apparatus 1 utilizes electrostatic charge to attract and hold a substrate 100 (e.g., a semiconductor wafer or the like), i.e., the object to be attracted, on the attraction surface 30a of the electrostatic chuck 30.

[Substrate Detaching Apparatus]

Figure 2A:
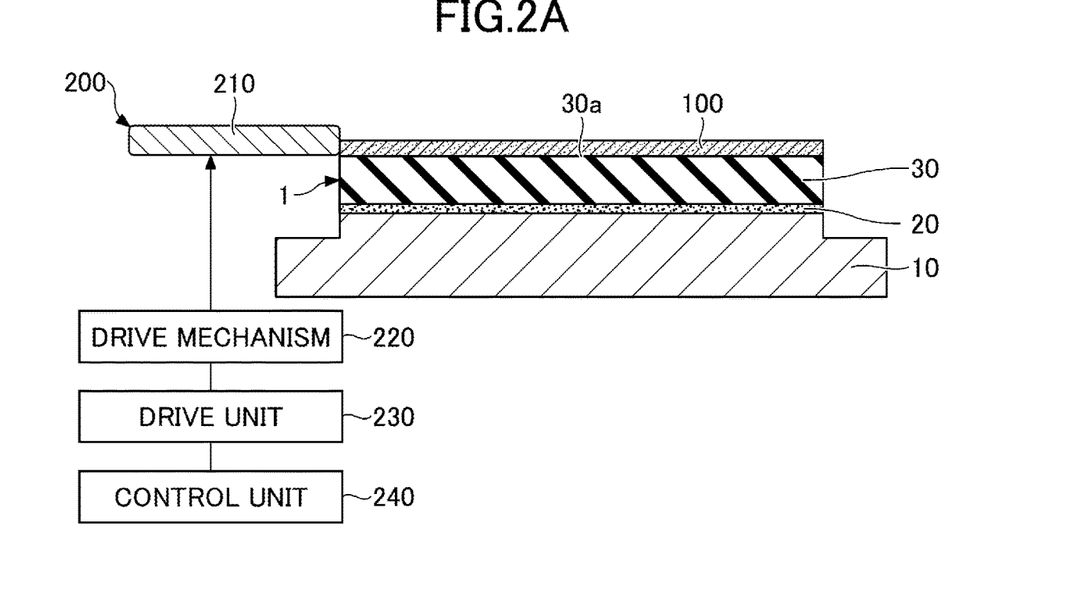
FIGS. 2A and 2B are drawings illustrating an example of a substrate detaching apparatus according to a first embodiment.
Figure 2B:
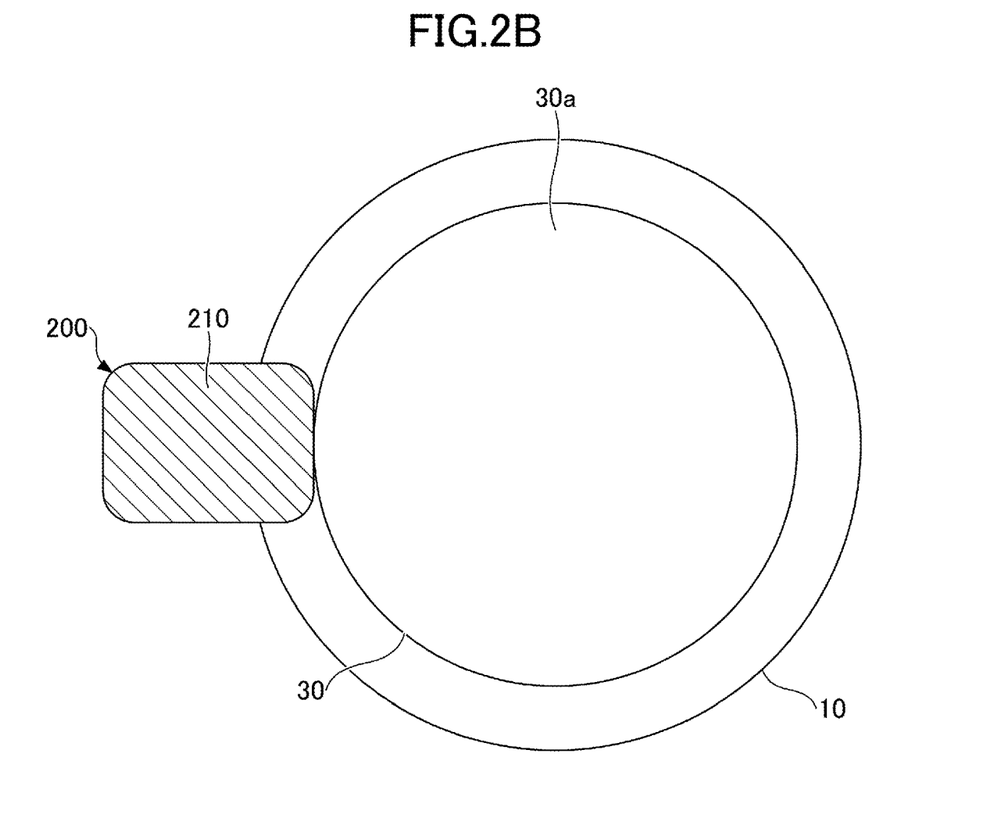

FIGS. 2A and 2B are drawings illustrating an example of the substrate detaching apparatus according to the first embodiment. FIG. 2A illustrates a cross-sectional view, and FIG. 2B illustrates a plan view. In FIG. 2B, a drive mechanism 220, a drive unit 230, and a control unit 240 illustrated in FIG. 2A are omitted from illustration.

As illustrated in FIGS. 2A and 2B, a substrate detaching apparatus 200 detaches from the electrostatic chuck 30 the substrate 100 attracted and held by the electrostatic chuck 30 of the substrate holding apparatus 1, and includes a moving unit 210, the drive mechanism 220, the drive unit 230, and the control unit 240. The substrate detaching apparatus 200 may be used together with the substrate holding apparatus 1 having the electrostatic chuck 30.

The moving unit 210 serves to push the substrate 100 in a horizontal direction (i.e., a direction parallel to the attraction surface 30a of the electrostatic chuck 30) to move the substrate 100. The moving unit 210 is made of a metal, for example, and is supported by the drive mechanism 220 such as to be at least capable of reciprocating movement in the horizontal direction. Examples of the metal constituting the moving unit 210 include stainless steel, aluminum alloy, and the like. As long as the substrate 100 can be moved along the attraction surface 30a of the electrostatic chuck 30, the moving unit 210 itself does not have to be arranged parallel to the attraction surface 30a. The moving unit 210 may be part of a robotic arm.

The drive mechanism 220 includes a drive force generating unit including a motor, and includes a drive force transmitting unit including a gear for transmitting the drive force generated by the drive force generating unit to the moving unit 210, for example. The drive unit 230 includes, for example, a drive circuit for supplying electrical power to the drive force generating unit of the drive mechanism 220, and operates in response to commands from the control unit 240. The control unit 240 issues commands to the drive unit 230 to control the position of the moving unit 210, for example. The moving unit 210 may further be configured to move in a vertical direction or in a rotational direction, in addition to required reciprocating movement in the horizontal direction.

The control unit 240 may be configured to include a CPU (central processing unit), a ROM (read only memory), a main memory, and the like, for example. In this case, various functions of the control unit 240 may be implemented by the CPU executing programs that are loaded from the ROM or the like to the main memory. A sensor for detecting the position of the substrate 100 may be disposed around the substrate 100, and the control unit 240 may control the moving unit 210 based on information from the sensor. The control unit 240 may include, as needed, other components, such as an interface for transmitting and receiving information to and from an external unit.

The moving unit 210 stays on standby at a position away from the substrate holding apparatus 1, and is then moved to a position from which the side edge of the substrate 100 can be pushed as illustrated in FIG. 2 after the completion of plasma processing or the like of the substrate 100 attracted and held by the substrate holding apparatus 1. The lower surface of the moving unit 210 may be positioned on the same plane as the attraction surface 30a, for example, but may be positioned above the attraction surface 30a.

Figure 3A:
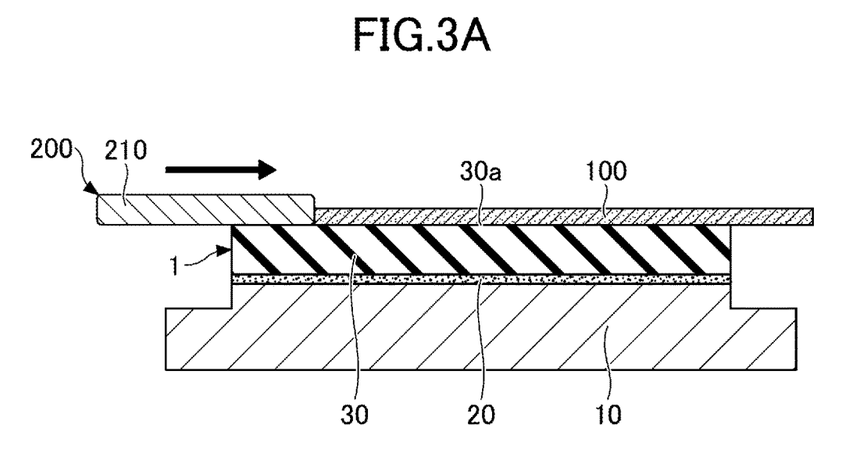
FIGS. 3A and 3B are drawings illustrating the functioning of the substrate detaching apparatus according to the first embodiment.
Figure 3B:
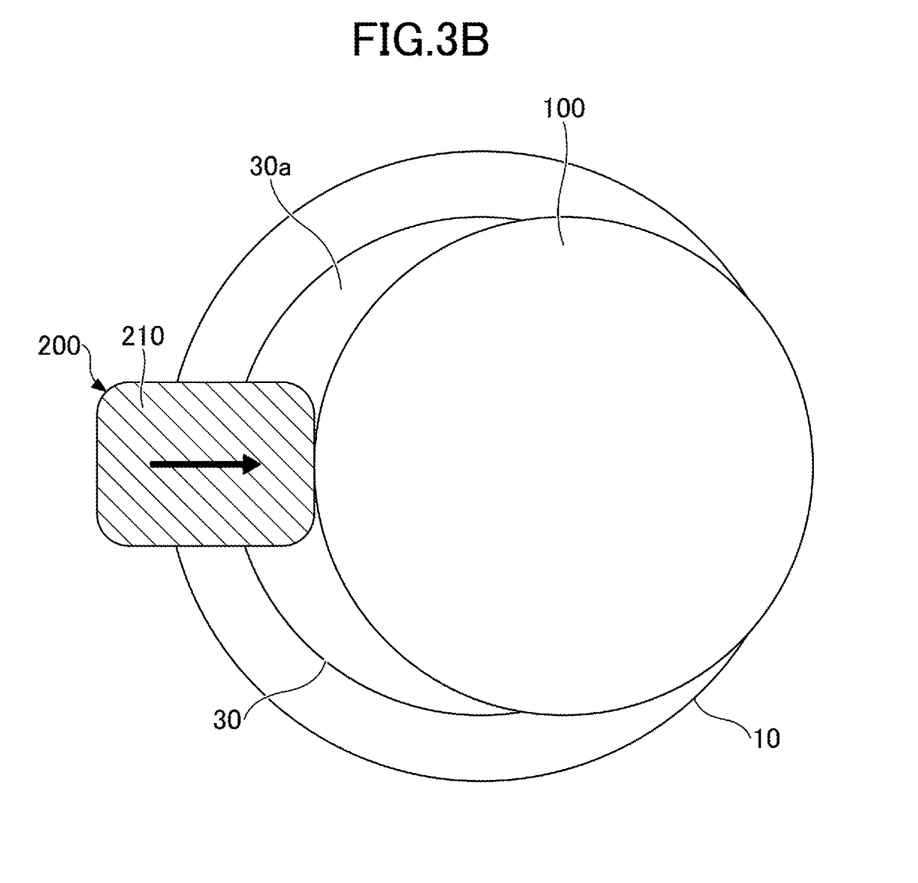

FIGS. 3A and 3B are drawings illustrating the functioning of the substrate detaching apparatus according to the first embodiment. FIG. 3A illustrates a cross-sectional view, and FIG. 3B illustrates a plan view. In FIGS. 3A and 3B, the drive mechanism 220, the drive unit 230, and the control unit 240 illustrated in FIG. 2A are omitted from illustration. In FIGS. 3A and 3B, the moving unit 210 of the substrate detaching apparatus 200 moves in the direction indicated by an arrow while pressing the substrate 100, so that the substrate 100 moves horizontally on the attraction surface 30a of the electrostatic chuck 30.

The substrate 100 attracted and held onto the attraction surface 30a of the substrate holding apparatus 1 is pushed in the direction indicated by the arrow by the moving unit 210 as illustrated in FIG. 3 after stopping the application of voltage for generating electrostatic charge, and is thus moved horizontally on the attraction surface 30a of the electrostatic chuck 30. The movement illustrated in FIG. 3 continues until the entirety of the substrate 100 is moved out of the attraction surface 30a of the electrostatic chuck 30.

The substrate 100 detached from the attraction surface 30a of the electrostatic chuck 30 is placed on a loading arm, for example, for transfer to the next processing site. Thereafter, the moving unit 210 moves to a position away from the substrate holding apparatus 1 to stay on standby. A next substrate is then attracted and held onto the attraction surface 30a of the electrostatic chuck 30, and is processed by plasma or the like. Subsequently, the moving unit 210 is moved to the position illustrated in FIG. 2. The next substrate is detached from the attraction surface 30a in the same manner as illustrated in FIG. 3, followed by being placed on the loading arm to be transferred to the next processing site. This cycle is repeated as many times as needed.

As described above, the substrate detaching apparatus 200 moves the substrate 100 electrostatically attracted and held onto the attraction surface 30a of the electrostatic chuck 30 in a direction parallel to the attraction surface 30a to detach it.

Figure 4:
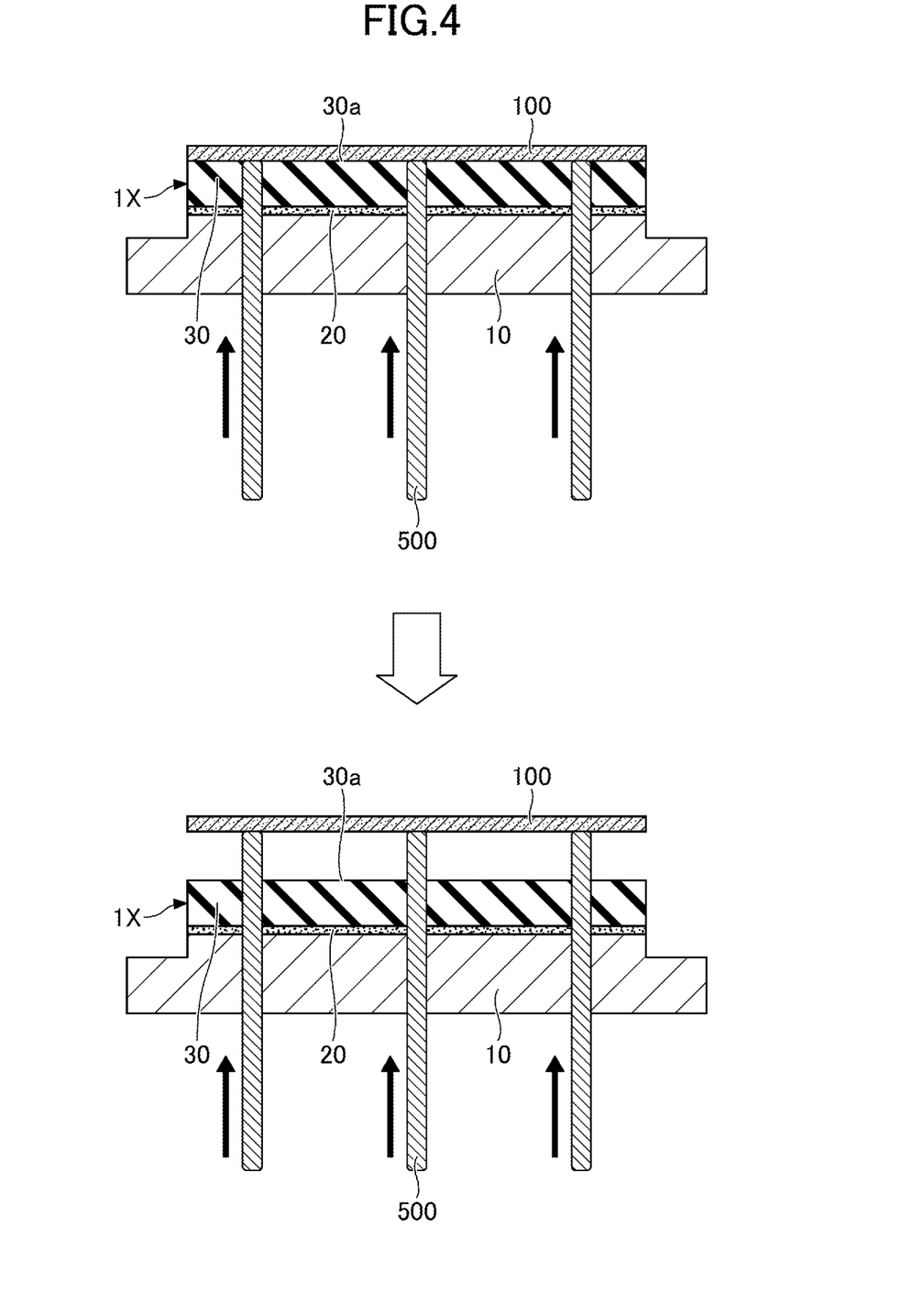
FIG. 4 is a cross-sectional view illustrating a related-art method of detaching a substrate from a substrate holding apparatus.

FIG. 4 is a cross-sectional view illustrating a related-art method of detaching a substrate from a substrate holding apparatus. A substrate holding apparatus 1X has through holes into which a plurality of lift pins 500 are inserted. The substrate 100 attracted and held onto the attraction surface 30a of the substrate holding apparatus 1X is lifted up and detached by the lift pins 500, which push the lower surface of the substrate 100 by moving in the direction indicated by arrows (i.e., in the vertical direction) after stopping the application of voltage for generating electrostatic charge.

However, in the method illustrated in FIG. 4, it takes time for a residual attraction force to disappear after the stoppage of the application of voltage. A waiting time is thus needed, thereby resulting in an increase in the processing time in some cases. In other cases, raising the lift pins 500 after the passage of a fixed time period following the stoppage of the application of voltage may create a misalignment of the substrate 100 due to the uneven distribution of the residual attraction force. This may prevent the normal transfer of the substrate 100.

In contrast, the method illustrated in FIG. 3 improves the above-noted problems by moving the substrate 100 electrostatically attracted and held onto the attraction surface 30a of the electrostatic chuck 30 in a direction parallel to the attraction surface 30a. This will be described in detail in the following.

In the related-art method illustrated in FIG. 4, vertically detaching the substrate 100 attracted and held onto the attraction surface 30a requires that a force stronger than a residual attraction force be evenly applied to the substrate 100. In contrast, the method according to the first embodiment illustrated in FIG. 3 can detach the substrate 100 by applying, in a direction parallel to the attraction surface 30a, a force exceeding the maximum static friction force generated between the attraction surface 30a and the substrate 100.

F' may denote a maximum static friction force, and p may denote the coefficient of maximum static friction, with N being a normal force. In such a case, the following relationship is satisfied: F'=μN. The normal force N is the sum of the mass of the substrate 100 and a residual attraction force. The maximum static friction coefficient μ depends on the state of materials in contact with each other (e.g., the property of material, surface roughness, etc.), but is generally less than or equal to 1 (approximately 0.3 to 0.6). As a result, the substrate 100 can be moved horizontally by applying a force that is lower than the force required to lift up the substrate 100 vertically against the residual attraction force.

Further, the method of lifting up the substrate 100 in the direction perpendicular to the attraction surface 30a with the lift pins 500 may readily create elastic deformation of the substrate 100 due to the residual attraction force acting against the upward movement of the lift pins 500 and also a misalignment of the substrate 100 in plane coordinates upon recovery from the elastic deformation. In contrast, the method of horizontally moving the substrate 100 does not cause deformation of the substrate 100, and thus does not cause a resultant misalignment of the substrate 100 in plane coordinates.

As is described above, the method of horizontally moving the substrate 100 can detach the substrate 100 from the attraction surface 30a with a lower force than in the related-art method of vertically moving the substrate 100. Further, the misalignment of the substrate 100 can be reduced at the time of detaching the substrate 100, which enables the normal transfer of the substrate 100. Since the time required to wait for the disappearance of a residual attraction force upon stopping the application of voltage can be shortened, the processing time can also be shortened.

[Specific Example of Substrate Holding Apparatus]

A specific example of the substrate holding apparatus to which the substrate detaching apparatus is applicable will be described in the following. It may be noted that the following description is intended to illustrate only an example of the substrate holding apparatus to which the substrate detaching apparatus is applicable, and is not intended to provide a limiting example.

Figure 5A:
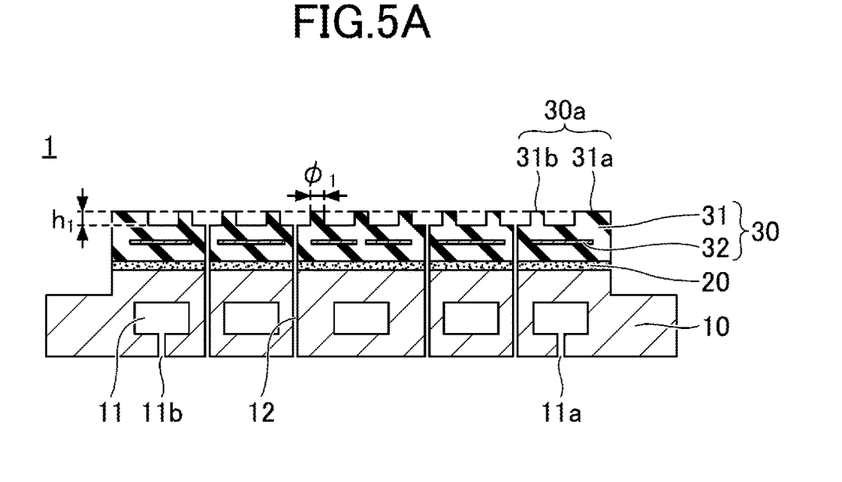
FIGS. 5A and 5B are drawings illustrating a more specific configuration of the substrate holding apparatus.
Figure 5B:
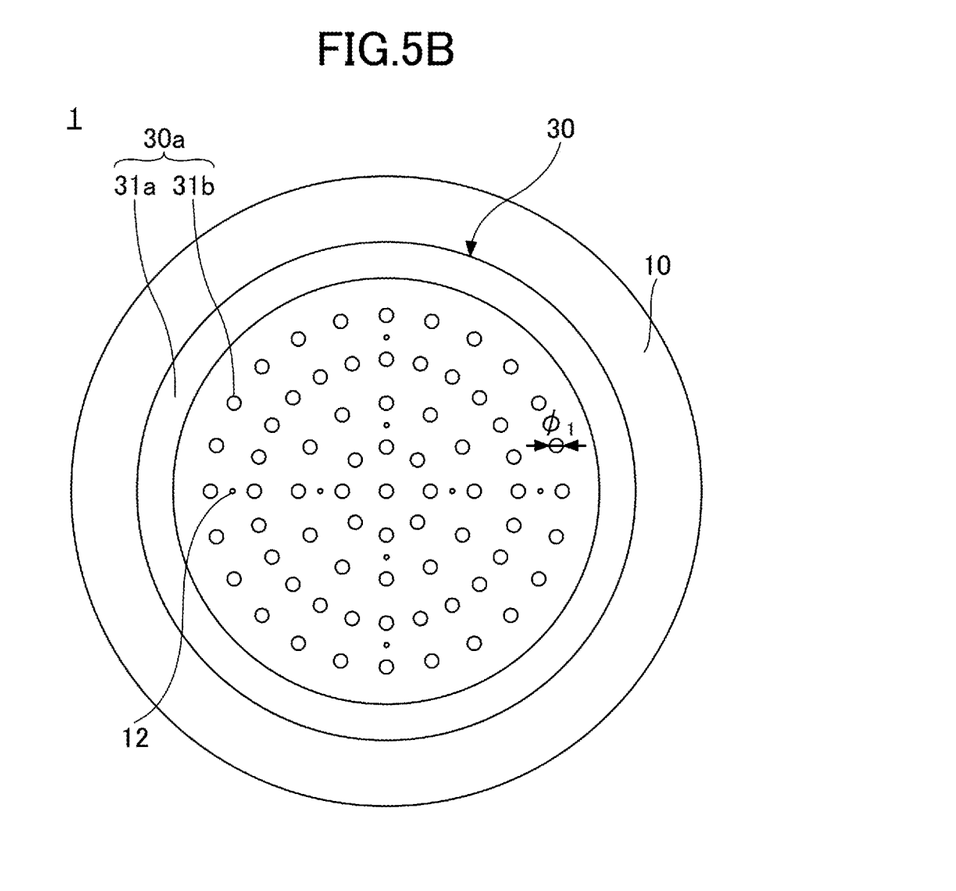

FIGS. 5A and 5B are drawings illustrating a more specific configuration of the substrate holding apparatus. FIG. 5A is a cross-sectional view, and FIG. 5B is a plan view. As illustrated in FIG. 5A and FIG. 5B, the substrate holding apparatus 1 includes the baseplate 10, the adhesive layer 20, and the electrostatic chuck 30 as main components.

The baseplate 10 serves to support the electrostatic chuck 30. The thickness of the baseplate 10 may approximately be in a range of 20 mm to 40 mm, for example. The baseplate 10 may be made of a metallic material such as aluminum or a cemented carbide, or a composite material of the noted metallic material and ceramics, for example, and may serve as an electrode or the like for controlling plasma. From the viewpoint of availability, ease of processing, good thermal conductivity, and the like, aluminum or an alloy thereof may preferably be used with the surface thereof being subjected to an alumite treatment (i.e., formation of an insulating layer), for example.

Supplying a predetermined high-frequency electric power to the baseplate 10 enables the control of energy with which generated plasma ions impact a substrate held on the electrostatic chuck 30, thereby achieving an efficient etching process, for example.

The baseplate 10 may have a water pathway 11 disposed therein. The water pathway 11 has a coolant-water inlet 11a at one end and a coolant-water outlet 11b at the other end. The water pathway 11 is connected to a coolant water control apparatus (not shown) provided outside the substrate holding apparatus 1. The coolant water control apparatus (not shown) feeds coolant water into the water pathway 11 at the coolant-water inlet 11a, and receives coolant water discharged from the coolant-water outlet 11b. Circulating coolant water through the water pathway 11 to cool the baseplate 10 causes a substrate held on the electrostatic chuck 30 to be cooled.

The electrostatic chuck 30 is fixedly attached to one surface of the baseplate 10 through the adhesive layer 20. A silicone-based adhesive, for example, may be used as the adhesive layer 20. The thickness of the adhesive layer 20 is approximately in a rage of 0.01 mm to 1.0 mm, for example. The adhesive layer 20 serves to bond the baseplate 10 to the electrostatic chuck 30 and to reduce the stress caused by the difference in thermal expansion coefficients between the ceramic electrostatic chuck and the aluminum baseplate 10. It may be noted that the electrostatic chuck 30 may alternatively be secured to the baseplate 10 with screws.

The electrostatic chuck 30 includes a base 31 and electrostatic electrodes 32 as main components. The plane shape of the electrostatic chuck 30, which is determined in accordance with the shape of a substrate, may be circular, for example. The diameter of a substrate that is an object to be attracted by the electrostatic chuck 30 may be 8, 12, or, 18 inches, for example. The electrostatic chuck 30 may be a Johnsen-Rahbeck electrostatic chuck or a Coulomb-type electrostatic chuck.

A plan view refers to a view of an object taken in the direction perpendicular to the attraction surface 30a of the base 31, and a plane shape refers to the shape of an object as viewed in the direction perpendicular to the attraction surface 30a of the base 31.

The base 31 is made of a dielectric material, which may be a ceramic such as aluminum oxide ($Al_2O_3$), aluminum nitride (AlN), or the like. The thickness of the base 31 may approximately be in a range of 0.5 mm to 10 mm. The relative permittivity of the base 31 at 1 KHz may approximately be in a range of 9 to 10.

The electrostatic electrode 32 is a thin-film electrode that is embedded in the base 31. The electrostatic electrodes 32 are coupled to a power supply (not shown) provided separately from the substrate holding apparatus 1. Upon receiving a predetermined voltage from the power supply, the electrostatic electrodes 32 generate an electrostatic attracting force with respect to a substrate. This causes the substrate to be attracted to and held onto the attraction surface 30a of the base 31 of the electrostatic chuck 30. The attracting force increases as the voltage applied to the electrostatic electrode 32 increases. The electrostatic electrode 32 may have either a monopole structure or a dipole structure. Tungsten, molybdenum, or the like may be used as the material of the electrostatic electrode 32.

A heating element may be provided inside the base 31 to generate heat by receiving voltage from outside the substrate holding apparatus 1 thereby to increase the temperature of the attraction surface 30a of the base 31 to a predetermined temperature.

The periphery of the upper surface of the base 31 is provided with an annular protrusion 31a, for example, in the form of a ring in a plan view. A number of columnar protrusions 31b having a cylindrical shape or the like are arranged in a polka-dot pattern inside the annular protrusion 31a in a plan view. The height h1 of the top surface is the same for the annular protrusion 31a and the columnar protrusions 31b. The height h1 may be, for example, in a range of 10 μm to 30 μm. The diameter φ1 of the top surface of the columnar protrusions 31b may be, for example, in a range of 1.0 mm to 2.0 mm. The top surface of the annular protrusion 31a and the top surface of the columnar protrusions 31b constitute the attraction surface 30a which attracts and holds an object.

The electrostatic chuck 30 and the baseplate 10 have gas pathways 12 provided therein that supply a gas for cooling a substrate attracted to and held onto the electrostatic chuck 30. The gas pathways 12 are holes formed in the baseplate 10, the adhesive layer 20, and the base 31. The number of gas pathways 12, which can properly be determined according to need, may approximately be ten to one hundred, for example. An inert gas, for example, is introduced into the gas pathways 12 from a source situated outside the substrate holding apparatus 1. Helium gas, argon gas, or the like, for example, may be used as the inert gas.

The effect of a residual attraction force of the electrostatic chuck 30 is preferably reduced when the substrate 100 is moved horizontally and detached from the attraction surface 30a of the electrostatic chuck 30. The effect of a residual attraction force of the electrostatic chuck 30 is effectively reduced by reducing the static friction coefficient of the attraction surface 30a. In order to reduce the static friction coefficient of the attraction surface 30a, the smaller the surface roughness of the attraction surface 30a is, the better the outcome will be. Namely, it is preferable to reduce as much as possible the roughness of the upper surface of the annular protrusion 31a and the upper surface of the columnar protrusions 31b that serve as the attraction surface 30a. For example, the surface roughness Ra of the upper surface of the annular protrusion 31a and the upper surface of the columnar protrusions 31b that serve as the attraction surface 30a may be greater than or equal to 0 and less than or equal to 0.2 μm.

The material of the base 31 of the electrostatic chuck 30 is often a ceramic. For the purpose of reducing the surface roughness of the attraction surface 30a, a denser structure having a porosity of less than or equal to 1% is preferable. The surface roughness of the attraction surface 30a also greatly depends the type of material used for the base 31. Using a ceramic such as hexagonal boron nitride is expected to achieve a static friction coefficient that is far lower than 0.1. However, some ceramic materials, such as aluminum-oxide-based ceramics, are generally chosen as the material for the base 31 because of the trade-offs with other requirements for the material of an electrostatic chuck (e.g., plasma resistance, mechanical strength, hardness, price, etc.).

Further, when the substrate 100 is horizontally moved and detached from the attraction surface 30a of the electrostatic chuck 30, the sliding surfaces are constituted by the substrate 100 and the attraction surface 30a. Because of this, there is a concern about the generation of particles due to sliding (i.e., the generation of fragments due to wearing from friction). In consideration of the size reduction and density increase of semiconductor circuits, the generation of particles needs be strictly controlled. Reducing the generation of particles requires reducing sliding resistance as much as possible. Improving the smoothness of the attraction surface 30a to reduce the static friction coefficient of the attraction surface 30a is an effective measure in this case also.

Figure 6:
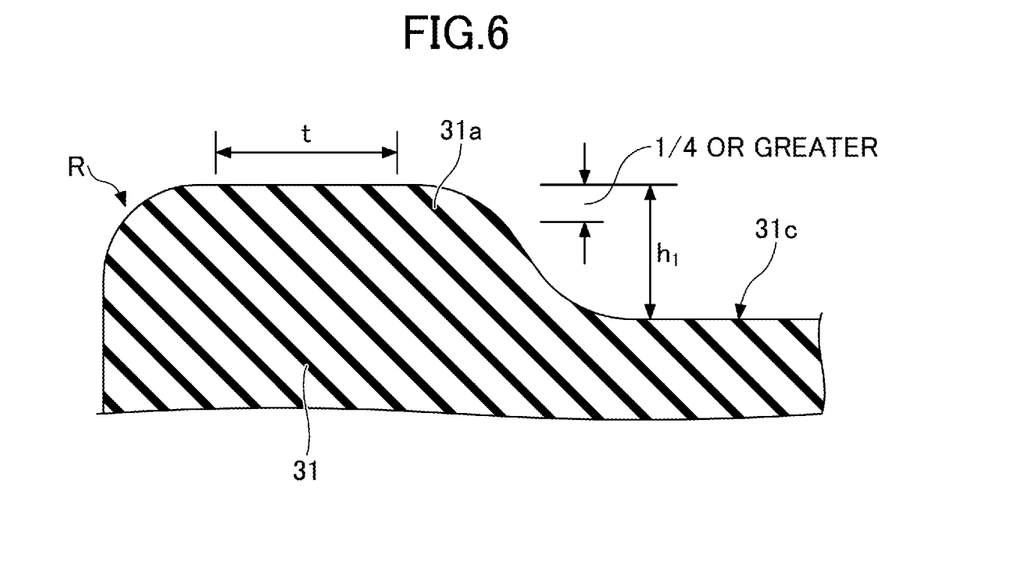
FIG. 6 is a drawing illustrating the shape of an annular protrusion constituting an attraction surface.

The portion where particles are likely to be generated due to sliding movement of the substrate 100 and the attraction surface 30a is the periphery of the attraction surface 30a. It is thus preferable that the edges of the annular protrusion 31a situated at the periphery of the attraction surface 30a have an obtuse angle, and more preferably be a smooth curved surface. For example, as illustrated in FIG. 6, the edges of the upper surface (i.e., the surface in contact with the substrate 100) of the annular protrusion 31a constituting the attraction surface 30a preferably have a rounded profile.

Specifically, the annular protrusion 31a of the electrostatic chuck 30 preferably has a radius of curvature R greater than or equal to approximately 0.01 mm at an edge where the upper surface and the lateral surface intersect. Use of the radius of curvature R below 0.01 mm results in an increased sharpness at the edges and thus an increase in the likelihood of particle generation. De-chuck characteristics are also lowered. Such characteristic changes also depend on the size of the portion having the radius of curvature R. According to the present inventor's understanding, the portion having the radius of curvature R preferably accounts for approximately greater than or equal to a quarter of the height h1 of the annular protrusion 31a. The size of this portion falling below the quarter results in an insufficient effect of the radius of curvature R and thus an increase in the likelihood of particle generation. De-chuck characteristics are also lowered.

The top surface of the annular protrusion 31a has, around the center thereof (i.e., the portion indicated by t in FIG. 6), a mirror finish surface that is protected and sustained by a masking means. This arrangement also contributes to the prevention of particle generation and the improvement of de-chuck characteristics. Preferably, the surface roughness Ra of the mirror finish surface is about less than or equal to 0.2 μm. The surface 31c of the electrostatic chuck 30, except for the annular protrusion 31a, is a blasted surface, and the surface roughness Ra thereof is typically in a range of approximately 0.2 μm to 1.0 μm. However, if additional blasting is performed to provide the radius of curvature R, the surface roughness Ra may further be reduced to, for example, 0.3 μm or less.

Various methods may enable the provision of the radius of curvature R to the annular protrusion 31a. For example, the annular protrusion 31a may be formed on the surface of the electrostatic chuck 30 by embossing, and, then, the edges of the annular protrusion 31a may be smoothed by post-processing such as polishing or blasting. Alternatively, the edges of the annular protrusion 31a may be smoothed at the time of forming the annular protrusion 31a on the surface of the electrostatic chuck 30 by embossing.

The above-noted arrangement has been directed to the annular protrusion 31a. Similarly, the edges of the upper surface (i.e., the surface in contact with the substrate 100) of the columnar protrusions 31b serving as the attraction surface 30a preferably have a rounded profile. This can reduce the surface roughness of the attraction surface 30a.

Variations of First Embodiment

The variations of the first embodiment are directed to an example of a substrate detaching apparatus having a different configuration than that of the first embodiment. In connection with the variations of the first embodiment, a description of the same or similar constituent elements as those of the previously provided descriptions may be omitted as appropriate.

Figure 7:
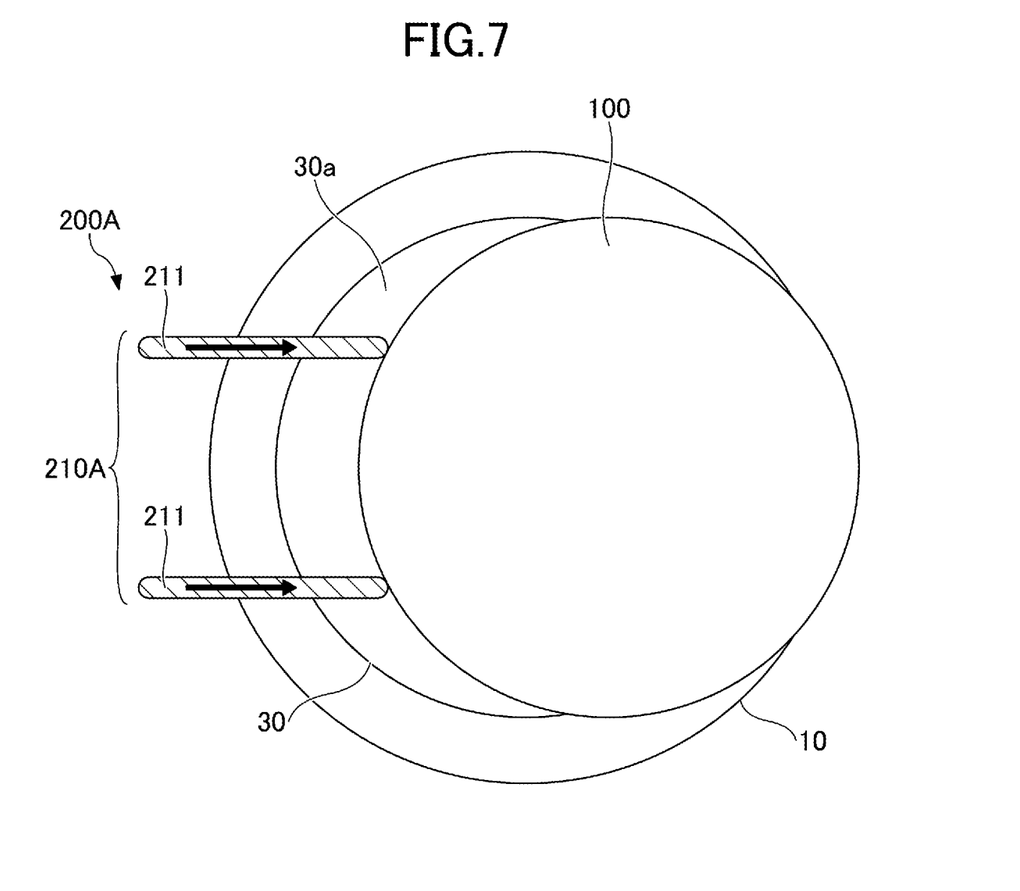
FIG. 7 is a plan view illustrating an example of a substrate detaching apparatus according to a first variation of the first embodiment.

FIG. 7 is a plan view illustrating an example of a substrate detaching apparatus according to a first variation of the first embodiment. In FIG. 7, the drive mechanism 220, the drive unit 230, and the control unit 240 illustrated in FIG. 2A are omitted from illustration. In FIG. 7, a moving unit 210A of a substrate detaching apparatus 200A moves in the direction indicated by arrows while pressing the substrate 100, so that the substrate 100 moves horizontally on the attraction surface 30a of the electrostatic chuck 30.

The substrate detaching apparatus 200A may be structured such that, as illustrated in FIG. 7, the moving unit 210A has two or more elongate parts 211 spaced apart from each other and having the longitudinal direction thereof aligned in the direction of movement. The structure of the moving unit 210A as illustrated in FIG. 7 can reduce a rotational displacement of the substrate 100 when the substrate 100 is moved in the direction indicated by the arrows. FIG. 7 illustrates an example having two elongate parts 211. Similarly, a configuration having three or more elongate parts 211 has the same effects.

Figure 8:
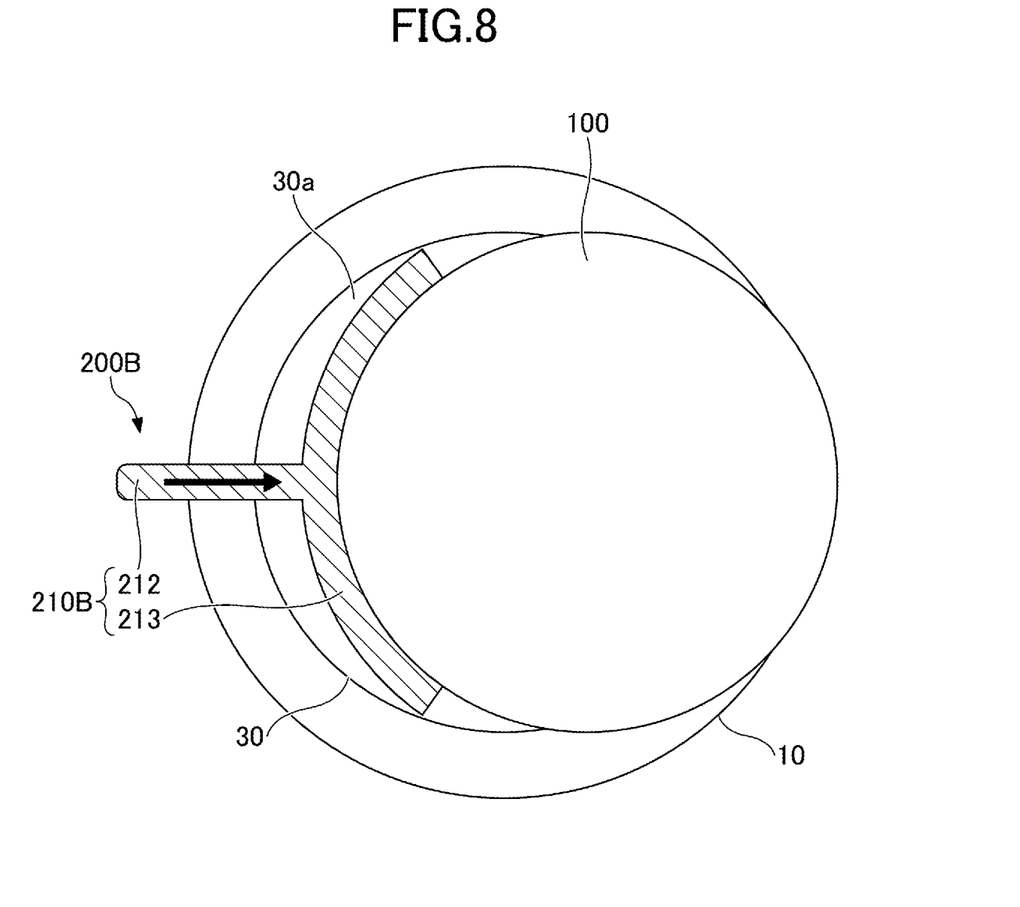
FIG. 8 is a plan view illustrating an example of a substrate detaching apparatus according to a second variation of the first embodiment.

FIG. 8 is a plan view illustrating an example of a substrate detaching apparatus according to a second variation of the first embodiment. In FIG. 8, the drive mechanism 220, the drive unit 230, and the control unit 240 illustrated in FIG. 2A are omitted from illustration. In FIG. 8, a moving unit 210B of a substrate detaching apparatus 200B moves in the direction indicated by arrows while pressing the substrate 100, so that the substrate 100 moves horizontally on the attraction surface 30a of the electrostatic chuck 30.

The substrate detaching apparatus 200B may be structured such that, as illustrated in FIG. 8, the moving unit 210B has an elongate part 212 and a curved part 213 disposed at one end of the elongate part 212. The curved part 213 has the same radius of curvature as the substrate 100, and is capable of contacting with less than or equal to half of the circumference of the substrate 100 in a plan view. The structure of the moving unit 210B as illustrated in FIG. 8 can reduce a rotational displacement of the substrate 100 when the substrate 100 is moved in the direction indicated by the arrows.

Figure 9A:
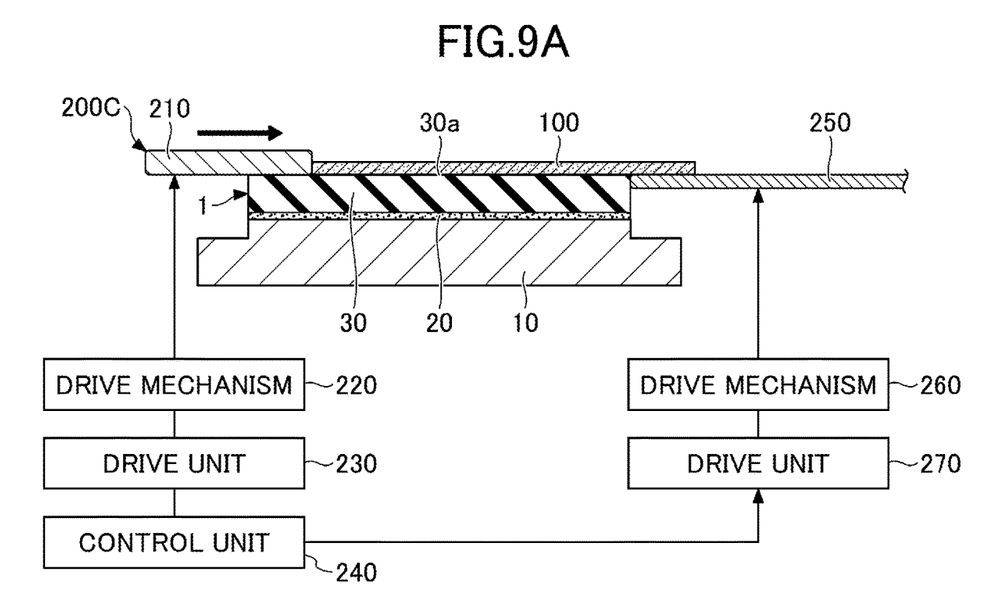
FIGS. 9A and 9B are drawings illustrating an example of a substrate detaching apparatus according to a third variation of the first embodiment.
Figure 9B:
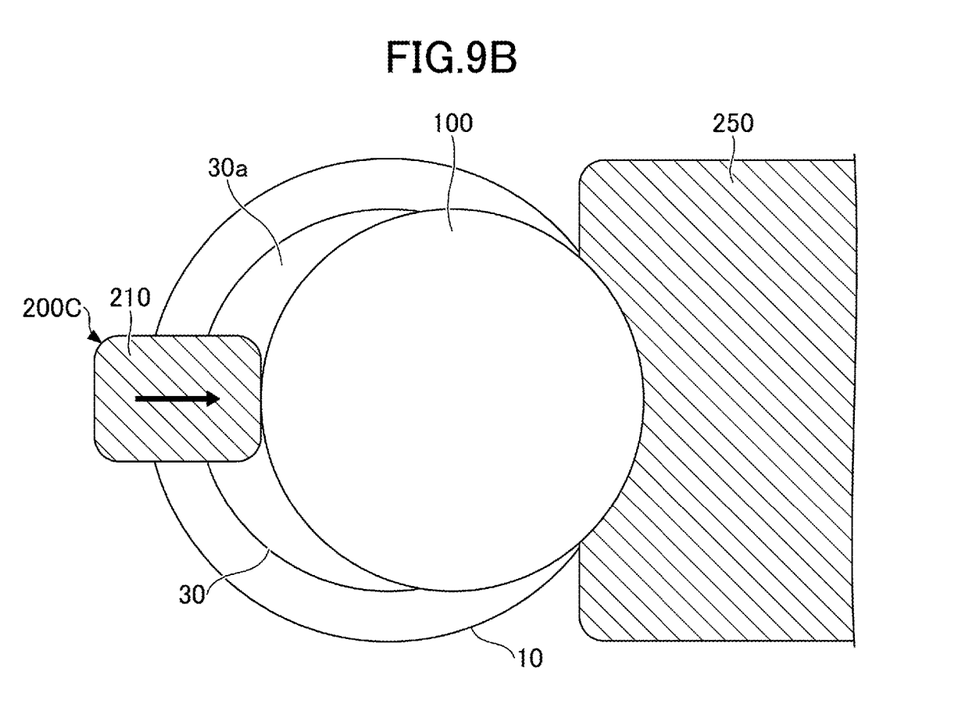

FIGS. 9A and 9B are drawings illustrating an example of the substrate detaching apparatus according to a third variation of the first embodiment. FIG. 9A illustrates a cross-sectional view, and FIG. 9B illustrates a plan view. In FIG. 9B, the drive mechanisms 220 and 260, the drive units 230 and 270, and the control unit 240 illustrated in FIG. 9A are omitted from illustration. In FIGS. 9A and 9B, the moving unit 210 of a substrate detaching apparatus 200C moves in the direction indicated by an arrow while pressing the substrate 100, so that the substrate 100 moves horizontally on the attraction surface 30a of the electrostatic chuck 30 toward a loading arm 250.

As illustrated in FIGS. 9A and 9B, the substrate detaching apparatus 200C differs from the substrate detaching apparatus 200 (see FIGS. 1A through 1C and the like) in that the loading arm 250, a drive mechanism 260, and a drive unit 270 are provided.

The loading arm 250 may be disposed at a position opposite from the moving unit 210 across the electrostatic chuck 30. The loading arm 250 carries and transfers the substrate 100 detached from the electrostatic chuck 30 to the next processing site. The loading arm 250 may be made of a metal, for example, and is supported by the drive mechanism 260 such as to be capable of moving in a predetermined direction. Examples of the metal constituting the loading arm 250 include stainless steel, aluminum alloy, and the like.

The drive mechanism 260 includes a drive force generating unit including a motor, and includes a drive force transmitting unit including a gear for transmitting the drive force generated by the drive force generating unit to the loading arm 250, for example. The drive unit 270 includes, for example, a drive circuit for supplying electrical power to the drive force generating unit of the drive mechanism 260, and operates in response to commands from the control unit 240. The control unit 240 issues commands to the drive unit 270 to control the position of the loading arm 250, for example.

The moving unit 210 and the loading arm 250 stay on standby at a position away from the substrate holding apparatus 1, and are then moved to the positions illustrated in FIGS. 9A and 9B after the completion of plasma processing or the like of the substrate 100 attracted and held by the substrate holding apparatus 1. The loading surface of the loading arm 250 is situated on the line on which the center of the substrate 100 moves, and is coplanar with the attraction surface 30a.

The loading arm may be provided separately from the substrate detaching apparatus, or may be part of the substrate detaching apparatus as illustrated in FIGS. 9A and 9B.

Figure 10A:
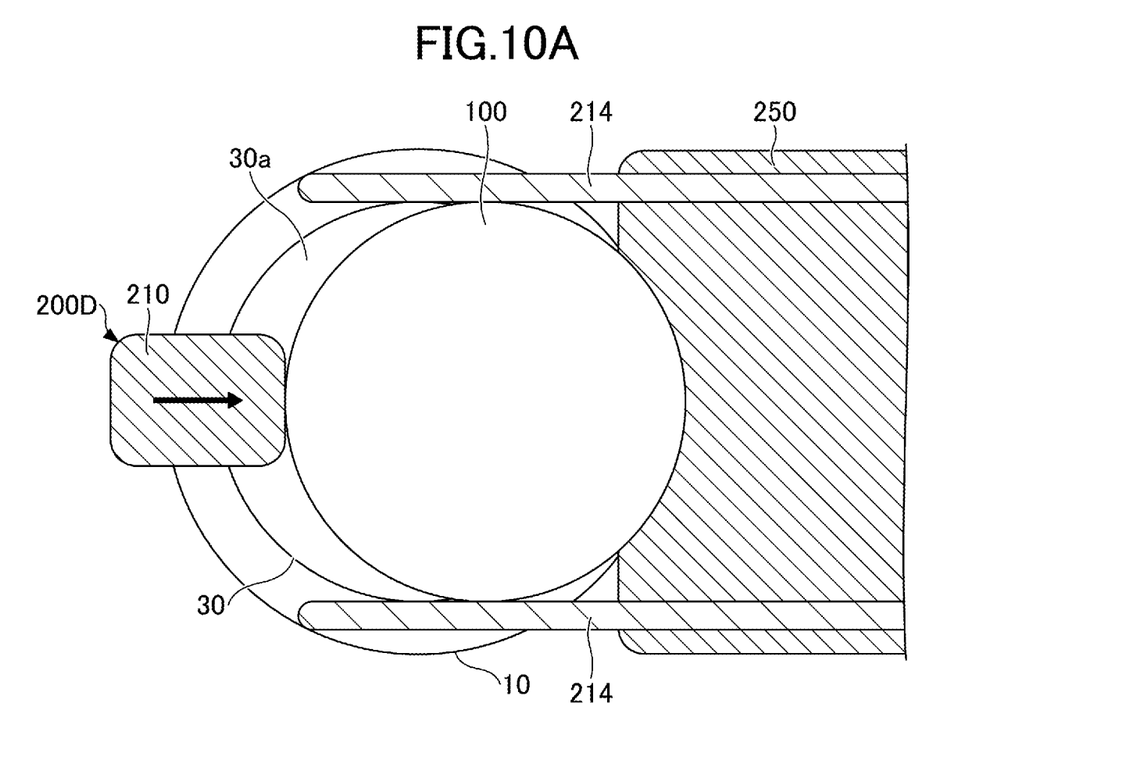
FIGS. 10A and 10B are drawings illustrating an example of a substrate detaching apparatus according to a fourth variation of the first embodiment.
Figure 10B:
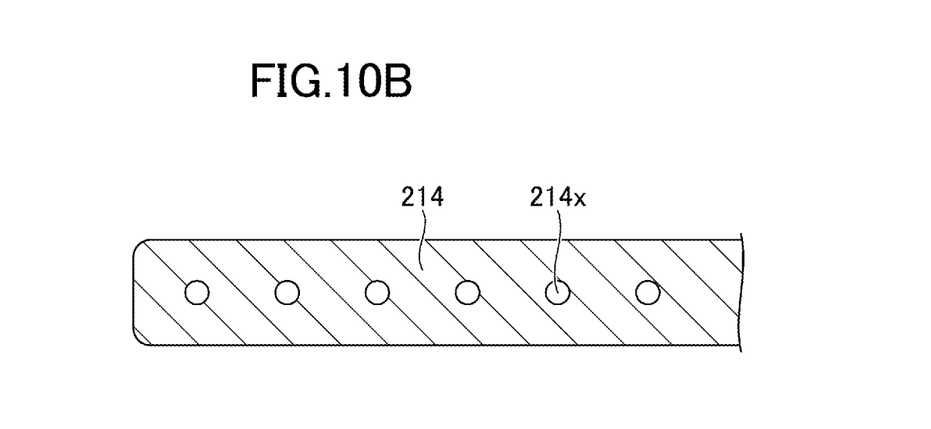

FIGS. 10A and 10B are drawings illustrating an example of the substrate detaching apparatus according to a fourth variation of the first embodiment. FIG. 10A illustrates a plan view, and FIG. 10B illustrates a side elevation view of a guide rail as viewed from the position of the substrate. In FIGS. 10A and 10B, the drive mechanisms 220 and 260, the drive units 230 and 270, and the control unit 240 illustrated in FIG. 9A are omitted from illustration. In FIGS. 10A and 10B, the moving unit 210 of a substrate detaching apparatus 200D moves in the direction indicated by an arrow while pressing the substrate 100, so that the substrate 100 moves horizontally on the attraction surface 30a of the electrostatic chuck 30 toward the loading arm 250.

As illustrated in FIGS. 10A and 10B, the substrate detaching apparatus 200D differs from the substrate detaching apparatus 200C (see FIGS. 9A and 9B) in that a pair of guide rails 214 is provided.

The guide rails 214 are spaced apart from each other, and have the longitudinal direction thereof aligned in the direction of movement of the substrate 100, thereby guiding the movement of the substrate 100 from both sides. The guide rails 214 are made of, for example, a metal. Examples of the metal constituting the guide rails 214 include stainless steel, aluminum alloy, and the like.

Preferably, each guide rail 214 extends to a position overlapping the loading arm 250 in a plan view. The provision of the guide rails 214 can reduce a rotational displacement of the substrate 100 when the substrate 100 is moved in the direction indicated by the arrow. In FIGS. 9A and 9B, the moving unit 210A or the moving unit 210B may be used in place of the moving unit 210.

The guide rails 214 stay on standby at a position away from the substrate holding apparatus 1, and are then moved together with the loading arm 250, for example, to the position illustrated in FIGS. 10A and 10B after the completion of plasma processing or the like of the substrate 100 attracted and held by the substrate holding apparatus 1.

The lateral surface of at least one of the guide rails 214 situated toward the substrate 100 preferably has a plurality of vacuum suction holes 214x arrayed in the longitudinal direction thereof, as illustrated in FIG. 10B. Connecting the vacuum suction holes 214x to a vacuum suction apparatus allows particles generated by the movement of the substrate 100 to be removed from the vicinity of the substrate 100 to the outside. A gas may be advantageously supplied through the gas pathways 12 (see FIGS. 5A and 5B) to the attraction surface 30a of the electrostatic chuck 30 for the purpose of controlling the direction of particle flow during vacuum suction.

It may be noted that a plurality of vacuum suction holes may similarly be provided, as in FIG. 10B, on the lateral surface of the curved part 213 facing the substrate 100 illustrated in FIG. 8. This arrangement also allows particles generated by the movement of the substrate 100 to be removed from the vicinity of the substrate 100 to the outside.

Figure 11:
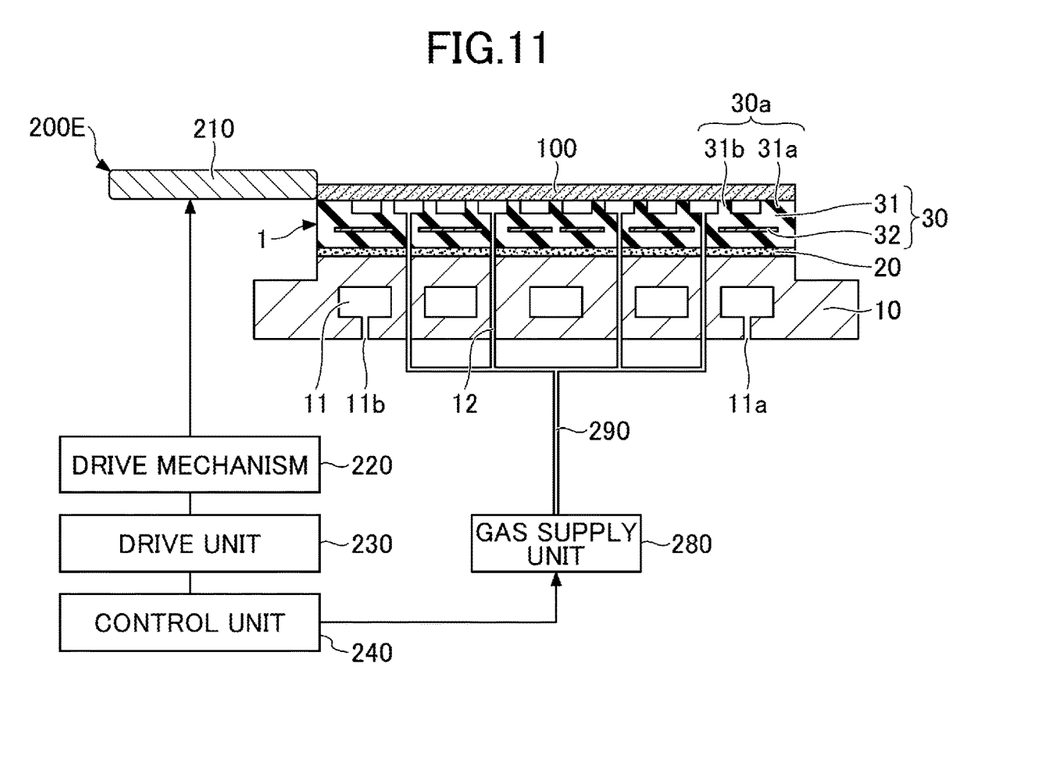
FIG. 11 is a cross-sectional view illustrating an example of a substrate detaching apparatus according to a fifth variation of the first embodiment.

FIG. 11 is a cross-sectional view illustrating an example of a substrate detaching apparatus according to a fifth variation of the first embodiment. The substrate detaching apparatus 200E illustrated in FIG. 11 is configured such that the control unit 240 can control a gas supply unit 280 disposed outside the substrate holding apparatus 1.

As illustrated in FIG. 11, the substrate detaching apparatus 200E differs from the substrate detaching apparatus 200 (see FIGS. 1A through 1C) in that the gas supply unit 280 and a gas supply pathway 290 are provided. The gas supply pathway 290 is in communication with the gas pathways 12.

In the substrate detaching apparatus 200E, the control unit 240 may control the gas supply unit 280 to supply gas to the attraction surface 30a of the electrostatic chuck 30 at any selected timing. Specifically, the control unit 240 may control the gas supply unit 280 such that a gas is supplied to the attraction surface 30a via the gas supply pathway 290 and the gas pathways 12 while the moving unit 210 pushes the substrate 100.

In this manner, it is preferable to provide the gas supply unit 280 that supplies gas to the attraction surface 30a via the gas pathways 12 of the electrostatic chuck 30 while the moving unit 210 pushes the substrate 100. Provision of gas during the pushing of the substrate 100 by the moving unit 210 causes a force acting in the direction opposite a residual attraction force to be applied to the substrate 100, thereby reducing the effect of the residual attraction force. As a result, the moving unit 210 can horizontally move the substrate 100 with a smaller force.

According to at least one embodiment, a substrate detaching apparatus is provided that is capable of reducing the effect of a residual attraction force of an electrostatic chuck.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present inventions have been described in detail, it should be understood that the various changes, substitutions, and alterations could be made hereto without departing from the spirit and scope of the invention.

What is claimed is:

1. A substrate detaching apparatus for detaching a substrate attracted to and held onto an attraction surface of an electrostatic chuck, comprising a moving unit configured to push a side edge of the substrate to move the substrate while maintaining contact with the attraction surface in a direction parallel to the attraction surface, an upper surface of the substrate being free of physical contact while the side edge of the substrate is being pushed, the side edge of the substrate being pushed while a residual attraction force of the electrostatic chuck applied to the substrate substantially remains.

2. The substrate detaching apparatus as claimed in claim 1, wherein the moving unit has two or more elongate parts spaced apart from each other, the elongate parts having a longitudinal direction thereof aligned in a direction of movement of the substrate.

3. The substrate detaching apparatus as claimed in claim 1, wherein the moving unit has a curved part that has a same radius of curvature as the substrate and that is capable of contacting with less than or equal to half of a circumference of the substrate in a plan view.

4. The substrate detaching apparatus as claimed in claim 3, wherein the curved part has a plurality of vacuum suction holes in a lateral surface toward the substrate.

5. The substrate detaching apparatus as claimed in claim 1, further comprising guide rails spaced apart from each other and having a longitudinal direction thereof aligned in a direction of movement of the substrate, the guide rails guiding movement of the substrate from both sides.

6. The substrate detaching apparatus as claimed in claim 5, wherein at least one of the guide rails has a plurality of vacuum suction holes in a lateral surface facing the substrate.

7. The substrate detaching apparatus as claimed in claim 1, further comprising a loading arm situated opposite from the moving unit across the electrostatic chuck, the loading arm configured to carry the substrate detached from the attraction surface, wherein a loading surface of the loading arm is situated on a line on which a center of the substrate moves, and is coplanar with the attraction surface.

8. The substrate detaching apparatus as claimed in claim 1, further comprising a gas supply unit configured to supply gas to the attraction surface via gas pathways of the electrostatic chuck while the moving unit pushes the substrate.

9. The substrate detaching apparatus as claimed in claim 1, wherein a surface roughness Ra of the attraction surface is less than or equal to 0.2 μm.

10. The substrate detaching apparatus as claimed in claim 1, wherein the attraction surface is constituted by top surfaces of a plurality of protrusions, and the top surfaces coming in contact with the substrate have edges with a rounded profile.

* * * * *